(12) United States Patent
Valle et al.

(10) Patent No.: US 10,645,849 B2
(45) Date of Patent: May 5, 2020

(54) ELECTRICAL SWITCHING DEVICE AND ASSOCIATED ELECTRICAL TRACTION BOX

(71) Applicant: ALSTOM Transport Technologies, Saint-Ouen (FR)

(72) Inventors: Gilles Valle, Soues (FR); Sébastien Nicolau, Loubajac (FR)

(73) Assignee: ALSTOM TRANSPORT TECHNOLOGIES, Saint-Ouen (FR)

( * ) Notice: Subject to any disclaimer, the term of this patent is extended or adjusted under 35 U.S.C. 154(b) by 0 days.

(21) Appl. No.: 16/029,009

(22) Filed: Jul. 6, 2018

(65) Prior Publication Data
US 2019/0014680 A1  Jan. 10, 2019

(30) Foreign Application Priority Data

Jul. 7, 2017 (FR) ...................................... 17 56422

(51) Int. Cl.
| | | |
|---|---|---|
| H05K 7/20 | (2006.01) | |
| B61C 3/00 | (2006.01) | |
| H02M 7/00 | (2006.01) | |
| H05K 5/00 | (2006.01) | |
| H05K 5/02 | (2006.01) | |

(52) U.S. Cl.
CPC ............... *H05K 7/209* (2013.01); *B61C 3/00* (2013.01); *H02M 7/003* (2013.01); *H05K 5/0008* (2013.01); *H05K 5/0204* (2013.01); *H05K 5/0217* (2013.01); *H05K 7/2049* (2013.01); *H05K 7/20927* (2013.01)

(58) Field of Classification Search
None
See application file for complete search history.

(56) References Cited

U.S. PATENT DOCUMENTS

| 5,793,106 | A | 8/1998 | Yasukawa et al. |
| 8,130,499 | B2* | 3/2012 | Ohnishi ................ H01L 23/053 |
| | | | 174/16.3 |
| 9,129,932 | B2 | 9/2015 | Hayashi et al. |
| 9,147,634 | B2* | 9/2015 | Kodama ............. H05K 7/2049 |
| 9,545,032 | B2* | 1/2017 | Baer .................. H05K 7/20436 |

(Continued)

FOREIGN PATENT DOCUMENTS

| EP | 2 725 609 A1 | 4/2014 |
| EP | 2 955 983 A1 | 12/2015 |
| JP | 2009-158632 A | 7/2009 |

OTHER PUBLICATIONS

FR Search Report, dated Apr. 20, 2018, from corresponding FR application No. 17 56422.

*Primary Examiner* — Courtney L Smith
(74) *Attorney, Agent, or Firm* — Young & Thompson

(57) ABSTRACT

This electrical switching device, able to be integrated into an electrical traction box including a cooling device of the switching device, includes an electrical assembly provided with an electrical switching element. This switching device also includes a base for receiving the electrical assembly, intended to be positioned between the electrical assembly and the cooling device, and pressing elements for pressing the electrical assembly extending between the support element and the base and configured to exert a bearing force on the base, able to keep the base bearing against the cooling device when the switching device is integrated into the traction box.

12 Claims, 3 Drawing Sheets

(56) References Cited

U.S. PATENT DOCUMENTS

| | | | |
|---|---|---|---|
| 9,648,769 B2* | 5/2017 | Tramet | H05K 7/1432 |
| 9,730,363 B2* | 8/2017 | Kawano | H05K 5/0278 |
| 2010/0176505 A1* | 7/2010 | Oyama | H01L 23/24 |
| | | | 257/692 |
| 2013/0075886 A1* | 3/2013 | Abe | H02M 7/003 |
| | | | 257/685 |
| 2013/0277820 A1* | 10/2013 | Hotta | H01L 23/4006 |
| | | | 257/712 |
| 2014/0252587 A1* | 9/2014 | Kodama | H05K 7/2049 |
| | | | 257/712 |
| 2015/0062811 A1 | 3/2015 | Suzuki et al. | |
| 2016/0295734 A1* | 10/2016 | Ueda | H05K 7/1432 |
| 2019/0057914 A1* | 2/2019 | Nakahara | H01L 23/10 |

* cited by examiner

ELECTRICAL SWITCHING DEVICE AND ASSOCIATED ELECTRICAL TRACTION BOX

This patent application claims the benefits of document FR 17 56422 filed on Jul. 7, 2017 which is hereby incorporated by reference.

FIELD OF THE INVENTION

The present invention relates to an electrical switching device for an electrical power module able to be integrated into an electrical traction box of a transport vehicle and an associated traction box comprising an electrical power module provided with the switching device and a cooling device able to cool the switching device.

The switching device comprises an electrical assembly provided with an electrical switching element, and a system for pressing the electrical assembly comprising a support element of the electrical assembly and pressing elements for the electrical assembly.

The invention applies to the transportation field, in particular rail transport, in particular to railway transport, particularly to electric traction transport vehicles, such as locomotives and electric railcars.

BACKGROUND OF THE INVENTION

Known from document JP 2009158632 A1 is a power module comprising a switching device equipped with a switching element able to be kept bearing against a cooling device using a spring system and a thermal diffuser positioned between the switching element and the cooling device. The spring system is configured to exert a bearing force on the top of the switching element in order to keep the thermal diffuser in contact with the cooling device.

However, in such a power module, the structure of the switching device remains complex and the performance of the heat exchanges with the cooling device remains to be improved.

SUMMARY OF THE INVENTION

The present invention therefore aims to propose a switching device for an electrical power module able to be integrated into an electrical traction box having a simplified structure and providing improved heat exchange performance with an associated cooling device.

To that end, the invention relates to a switching device of the aforementioned type comprising a base for receiving the electrical assembly, the base being intended to be positioned between the electrical assembly and the cooling device when the switching device is integrated into the traction box, and the pressing elements extending between the support element and the base and being configured to exert a bearing force on the base able to keep the base bearing against the cooling device when the switching device is integrated into the traction box.

With the switching device according to the invention, the switching device has a simplified structure, since the switching element does not need to be configured to withstand the bearing force directly and any risk of deformation of the switching element is avoided. Furthermore, the pressing elements used are less complex, and in particular have dimensions making them easier to assemble, since they extend between the support element and the base.

Furthermore, the thermal performance of the switching device according to the invention is improved, since the fact that the pressing elements exert the bearing force on the base makes it possible to improve the quality of the contact between the cooling device and the base, and therefore the heat exchanges between the switching element and the cooling device.

According to other aspects of the invention, the switching device includes one or more of the following features, considered alone or according to any technically possible combination(s):

- the switching device comprises a system for fastening in the traction box, the fastening system being able to keep the support element in a predetermined position relative to the cooling device;
- the fastening system is able to fasten the switching device removably to the cooling device;
- the switching device comprises a housing comprising the electrical assembly, the pressing system and the base;
- the electrical assembly is provided with a control unit for the switching element and electrical connections;
- the switching element is fastened to the base, and the base comprises, around the switching element, preferably around the electrical element, at least one pressing zone in contact with the pressing elements, the pressing zone extending globally parallel to a plane perpendicular to a direction of the bearing force; and
- the pressing elements are regularly distributed around the switching element, and preferably the electrical assembly.

The invention also relates to an electrical traction box of a transport vehicle, the traction box comprising:

- an electrical power module comprising at least one switching device as described above, and
- a cooling device able to cool each switching device.

According to other advantageous aspects of the invention, the traction box includes one or more of the following features, considered alone or according to all technically acceptable combinations:

- a dry thermal interface material, able to improve the thermal coupling between each base and the cooling device, is positioned between each base and the cooling device; and
- the cooling device comprises a heat exchanger, a cooling member of each switching device, the cooling member being in contact with each base of each switching device and a cooling circuit extending between the heat exchanger and the cooling member.

BRIEF DESCRIPTION OF THE DRAWINGS

These features and advantages of the invention will appear more clearly upon reading the following description, provided solely as a non-limiting example, and done in reference to the appended drawings, in which.

DETAILED DESCRIPTION OF THE PREFERRED EMBODIMENTS

Figure 1:
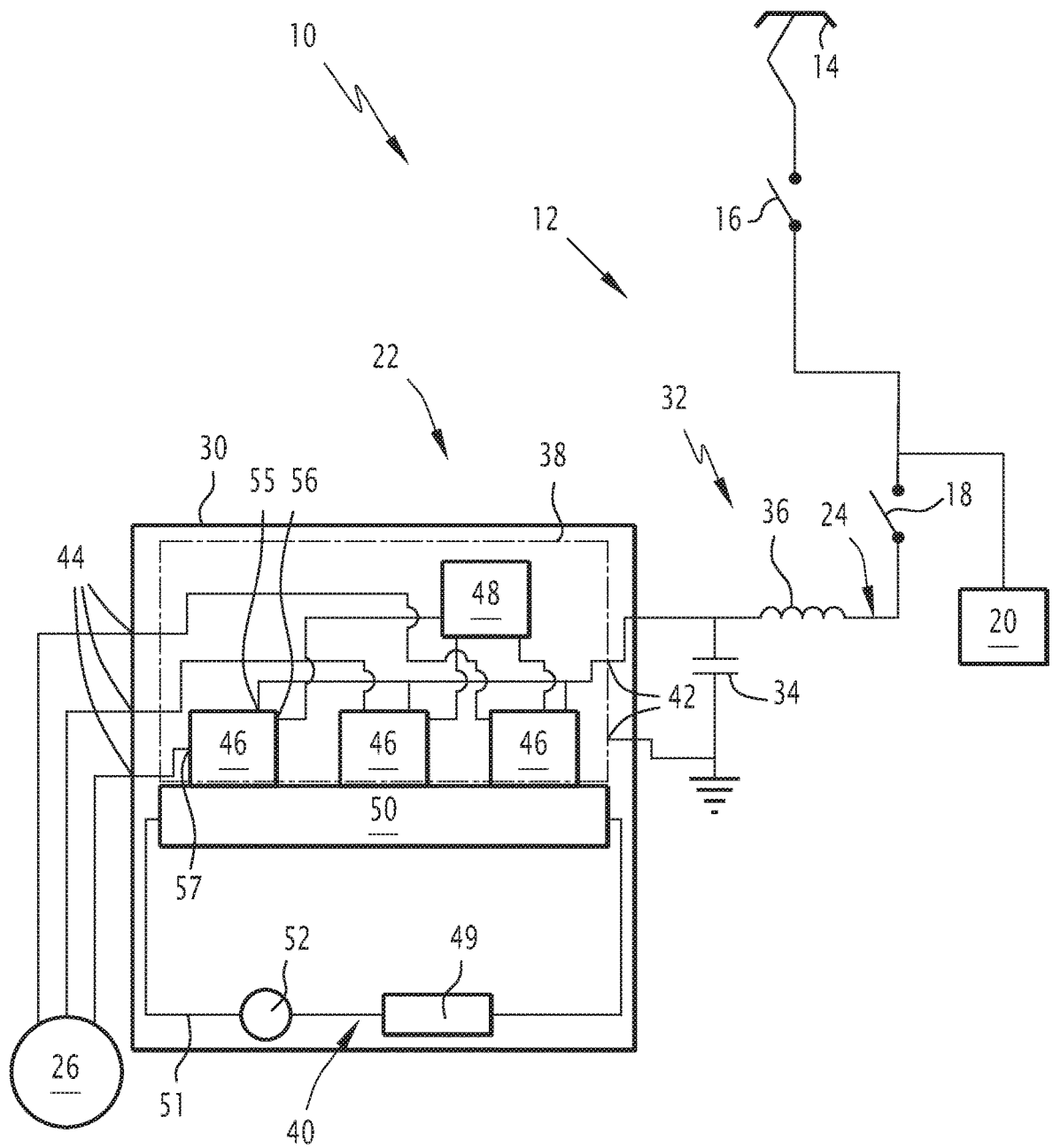
FIG. 1 is a schematic illustration of an electric transport vehicle, such as a rail vehicle, comprising a traction chain, the traction chain including a traction box according to one example embodiment of the invention.

In FIG. 1, an electric transport vehicle 10, such as a railway vehicle, is shown schematically.

The vehicle 10 comprises a traction chain 12.

The traction chain 12 includes a pantograph 14 able to be connected to a catenary, not shown, an electrical circuit breaker 16 connected to the pantograph 14 and an electrical switch 18 connected to the electrical circuit breaker 16.

The traction chain 12 also comprises a traction assembly 22 connected to the electoral switch 18, for example via which a DC bus 24.

As an optional addition, the traction chain 12 comprises an auxiliary piece of equipment 20 connected between the electrical circuit breaker 16 and the electrical switch 18, bypassing the electrical switch 18.

The electrical circuit breaker 16, the electrical switch 18 and the auxiliary piece of equipment 20 are known in themselves, and are not described in more detail. The auxiliary piece of equipment 20 is for example a static converter.

The traction assembly 22 includes an electric motor 26 and an electrical traction box 30 connected between the DC bus 24 and the electric motor 26. In the example of FIG. 1, the electrical traction box 30 is intended to deliver an alternating voltage to the motor 26 from a direct voltage derived from the DC bus 24.

Additionally, the traction assembly 22 includes a filter device 32, in particular including a filtering capacitor 34 and a filter choke 36.

As an optional addition, the traction assembly 22 includes an electrical energy storage device, not shown, the electrical energy storage device also being called autonomy box, and serving on the one hand as an auxiliary power source, and on the other hand to collect electrical energy during braking of the electric transport vehicle 10. The electrical energy storage device is for example connected on a bypass, between the electrical switch 18 and the filtering capacitor 34.

The electric motor 26 is for example an alternating motor, such as a three-phase motor.

The electric motor 26 is for example, positioned on a bogie, not shown, of the vehicle 10.

The electrical traction box 30 is, for example, positioned on the roof of the vehicle 10.

The electrical traction box 30 for example comprises an electrical power module such as an electrical energy converter 38 configured to convert a first electrical energy into a second electrical energy and a cooling device 40 for the electrical energy converter 38.

The electrical energy converter 38 is for example configured to convert a direct energy associated with the DC bus 24 into an alternating energy, such as a three-phase energy, associated with the electric motor 26. The first electrical energy is then the direct electrical energy, and the second electrical energy is the alternating energy, such as the three-phase energy.

The electrical energy converter 38 comprises two first terminals 42 associated with the first electrical energy, at least one second terminal 44 associated with the second electrical energy, and P switching devices 46, P being an integer greater than or equal to 1.

Figure 2:
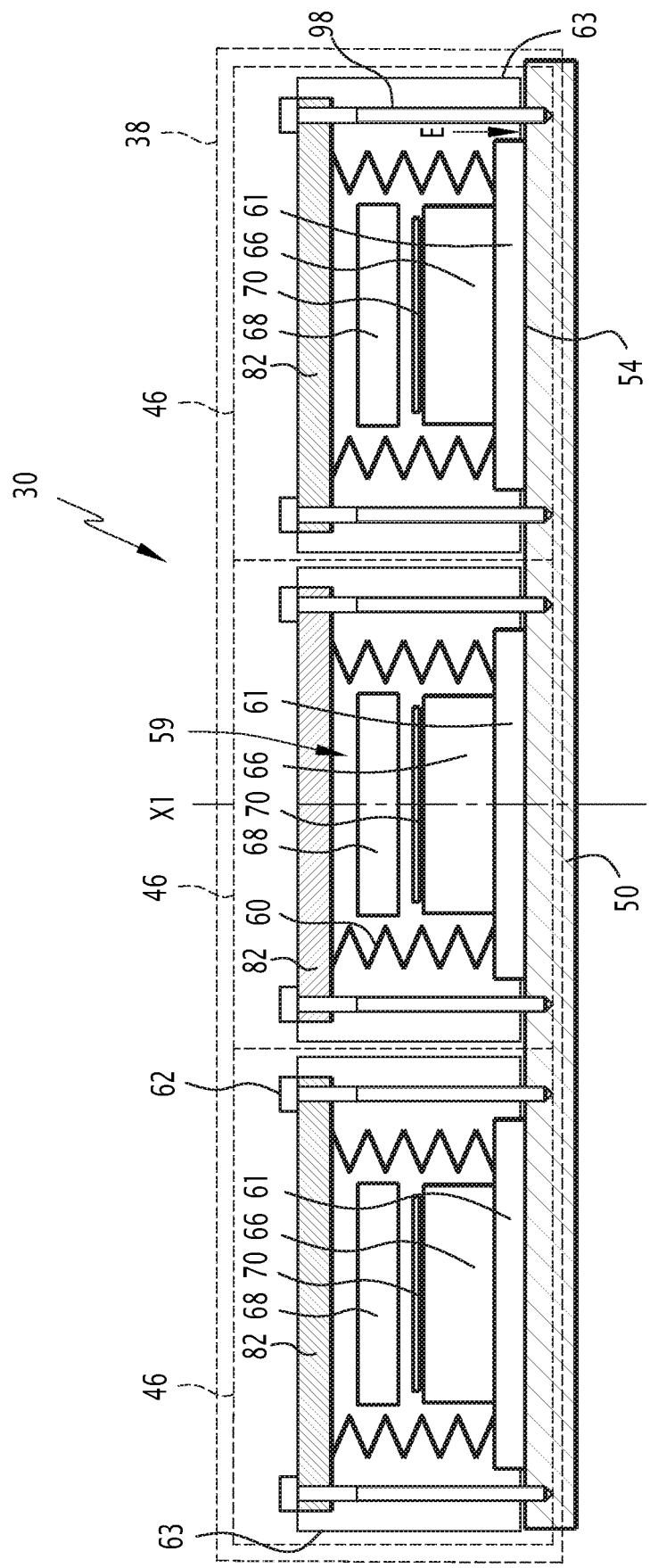
FIG. 2 is a more detailed schematic illustration of the traction box of FIG. 1, which comprises several switching devices according to one example embodiment of the invention.

In the example of FIGS. 1 and 2, the electrical energy converter 38 converts direct energy into three-phase alternating energy, and then comprises three second terminals 44 and three switching devices 46, i.e., a second terminal 44 and a switching device 46 for each phase of the three-phase energy.

Advantageously, the electrical energy converter 38 comprises a device 48 for controlling each switching device 46.

The cooling device 40 comprises a heat exchanger 49 and a cooling member 50 for each switching device.

The cooling device 40 also comprises a cooling circuit 51 extending between the heat exchanger 49 and the cooling member 50.

The cooling member 50 is for example a water plate able to be in contact with the switching devices 46. Alternatively, the cooling member is a thermal dissipater, such as a radiator or a diphasic cooler.

Advantageously, the cooling device also comprises a pump 52 able to circulate a heat transfer fluid in the cooling circuit 51 through the cooling member 50 and the heat exchanger 49.

The electoral traction box 30 comprises a dry thermal interface material 54, for example in the form of a plate 54, able to improve the thermal coupling between each switching device 46 and the cooling device 40. The thermal interface material is for example a graphite-based material.

Each plate 54 is positioned between each switching device 46 and the cooling member 50.

Each switching device 46 comprises at least one input terminal 55 able to be connected to the DC bus 24 via one of the first terminals 42.

Advantageously, each switching device 46 also comprises a control terminal 56 able to be connected to the control device 48.

Each switching device 46 also comprises an output terminal 57 able to be connected respectively to one of the second terminals 44.

Figure 3:
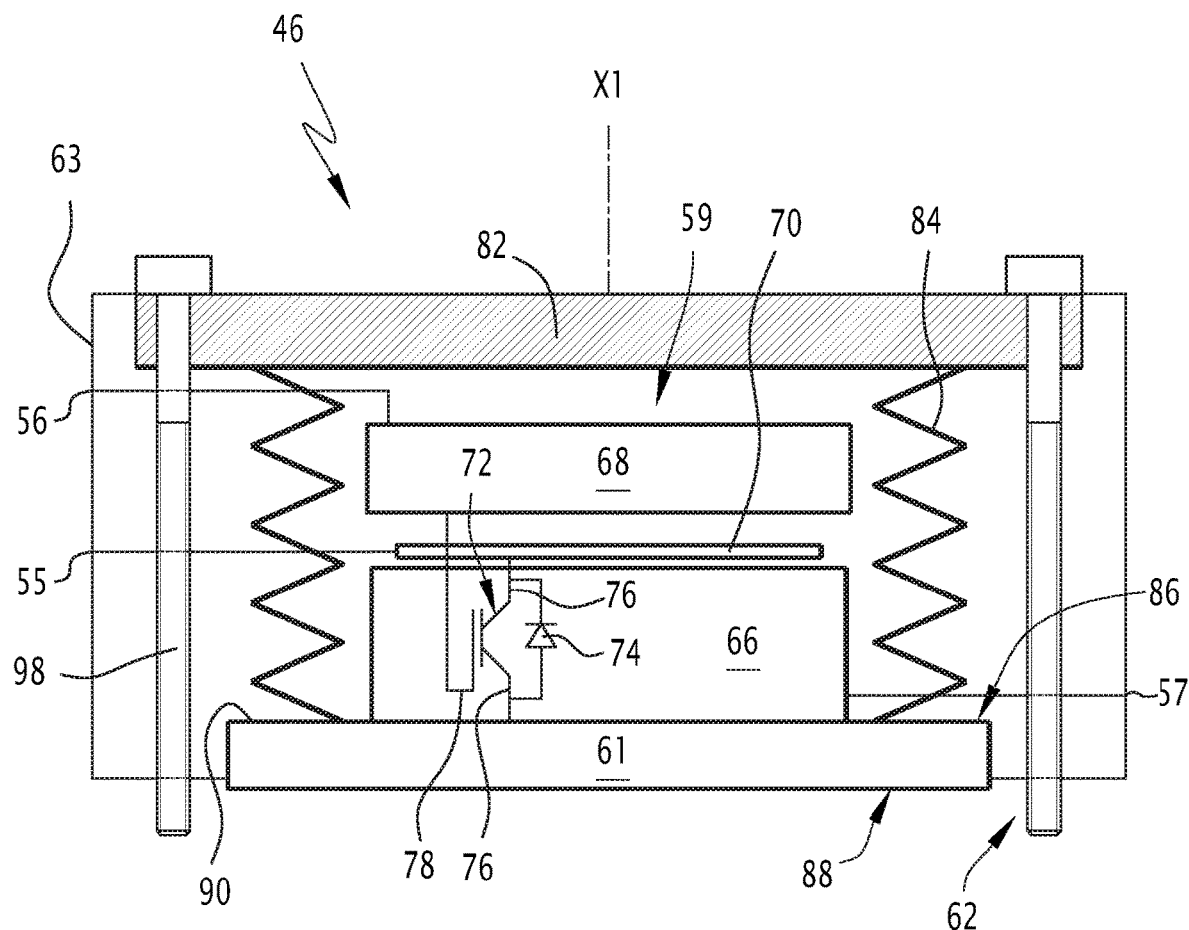
FIG. 3 is a more detailed schematic illustration of one of the switching devices of FIG. 2.

As shown in more detail in FIGS. 2 and 3, each switching device 46 comprises an electrical assembly 59, a system 60 for pressing the electrical assembly 59, a base 61 for receiving the electrical assembly, and a system 62 for fastening in the traction box 30.

Advantageously, each switching device 46 forms a replaceable element of the electrical energy converter 38 and includes a housing 63 comprising the electrical assembly 59, the pressing system 60 and the base 61.

Advantageously, the electrical assembly 59 and the base 61 are positioned above one another along an axis X1 perpendicular to the cooling member 50 when the switching device 46 is fastened in the traction box 30.

The electrical assembly 59 comprises at least one electrical switching element 66, a control unit 68 of the switching element 66 and electrical connections 70.

Advantageously, when the electrical assembly 59 comprises several switching elements 66, the electrical assembly 59 comprises a control unit 68 for each switching element 66.

Also advantageously, the switching element 66 and the base 61 form a single piece and/or the base 61 belongs to a housing receiving the switching elements 66 and advantageously also the control unit 68 and the electrical connections 70.

In the example of FIGS. 2 and 3, each electrical assembly 59 comprises a single switching element 66.

In the rest of the description, a single switching element 66 will be described, given that the switching elements 66 are preferably all identical.

The switching element 66 is fastened to the corresponding base 61.

The switching element 66, also called switch, is for example a two-way switch. Each switching element 66 is preferably a two-way switch.

When all of the switches 66 are two-way switches, the electrical energy converter 38 is then a two-way converter configured to convert the first electrical energy into the second electric energy if the current flows from the first terminals 42 toward the second terminal(s) 44, and conversely configured to convert the second electrical energy into the first electrical energy if the current flows from the second terminal(s) 44 toward the first terminals 42.

This reversed operation of the electrical energy converter 38 to convert the second electrical energy into the first electrical energy is in particular useful to recover energy during braking of the electric transport vehicle 10.

As shown very schematically in FIG. 3, the switching element 66 for example includes a controllable switching semiconductor component 72 and a diode 74 connected in antiparallel with the controllable switching semiconductor component 72. As is known in itself, each controllable switching semiconductor component 72 includes two conducting electrodes 76 and one control electrode 78, each controllable switching semiconductor component 72 being controllable, via its control electrode 78, between a state from among an on state, in which the current flows between the conducting electrodes 76, and an off state, in which the current does not flow between the conducting electrodes 76. The diode 74 is then connected between the conducting electrodes 76.

The controllable switching semiconductor component 72 is for example an insulated gate bipolar transistor.

The control unit 68, also called igniter, is configured to control the switching element 66.

The control unit 68 is connected to the corresponding control electrode 78.

The control unit 68 is for example made in the form of a programmable logic component, such as an FPGA (Field-Programmable Gate Array).

The control unit 68 is electrically connected to the control terminal 56. In other words, the control unit 68 is able to be connected to the control device 48 via the control terminal 56.

The electrical connections 70 are configured to connect the switching element 66 between the input terminal 55 and the output terminal 57.

The electrical connections 70 form at least one set of bars, also called busbar.

The pressing system 60 comprises a support element 82 for the electrical assembly 59 and elements 84 for pressing the electrical assembly 59 that extend between the support element 82 and the base 61 and are configured to exert a bearing force E on the base 61 able to keep the base bearing against the cooling device 40 when the electrical assembly 59 is integrated/fixed in the traction box 30.

The base 61 is intended to be positioned between the electrical assembly 56 and the cooling device 40, more specifically the cooling member 50, when the electrical assembly 56 is integrated into the traction box 30.

The base 61 comprises a first face 86 configured to be in contact with the switching element 66 and a second face 88, opposite the first face 86, configured to be in contact with the cooling member 50.

The base 61 comprises, around the switching element 66, preferably around the electrical assembly 59, a pressing zone 90 in contact with the pressing elements 84.

More generally, the base 61 for example corresponds to a wall of a housing receiving the switching elements 66 and advantageously also the control unit 68 and the electrical connections 70.

The pressing zone 90 is located on the first face 86 and extends globally parallel to a plane perpendicular to a direction of the bearing force E.

The pressing zone 90 is positioned on the perimeter of the base 61 relative to the electrical assembly 59, which has a central position on the base 61.

The pressing elements 84 are regularly distributed around the switching element 66, and preferably the electrical assembly 59.

The pressing elements 84 extend along the direction of the bearing force E and are for example formed by helical springs.

Alternatively, the pressing elements 84 are for example formed by hairpin springs with flat wires or Belleville washers.

The fastening system 62 is configured to keep the support element 82 in a predetermined position relative to the cooling device 40.

Advantageously, the fastening system 62 is configured to fasten the support element 82 to the cooling member 50 removably.

The fastening system 62 for example comprises screws 98 able to traverse the support element 82 and advantageously the housing 63 and to be received in fastening orifices arranged in the cooling member 50. Alternatively, the fastening system for example comprises quarter-turn screws or toggles.

Advantageously, the screws 98 are positioned parallel to the axis X1 on the outside of the switching device 46 relative to the electrical assembly 59 and the pressing elements 84 along the plane perpendicular to the direction of the bearing force E.

The fastening system 62 allows removable fastening of each switching device 46 in the traction box 30 and in particular removable fastening of each switching device 46 to the cooling member 50.

Furthermore, the fastening system 62 allows easy integration of each switching device 46 into the converter 38 and therefore modification of the configuration of the converter 38 in a simplified manner.

Furthermore, the fact that each switching device 46 forms a replaceable element makes it possible to simplify the maintenance of the traction box 30.

Furthermore, using several switching devices 46 in order to form an electrical converter 38 and separating the cooling function from the switching function also makes it possible to simplify the maintenance of the traction box 30.

More specifically, it is not necessary to manipulate the entire traction box 30 and the cooling member 50 when an electrical fault appears at the electrical converter 38. It suffices to identify the faulty switching device 46 and replace it.

Furthermore, the weight of each switching device 46 is minimized, such that they can be manipulated by a single operator without it being necessary to use tools dedicated to handling heavy loads.

Furthermore, using a dry thermal interface material makes it possible both to remove/install the switching device 46 easily in the converter 38, i.e., in the traction box 30, and to improve the heat exchanges between the switching device 46 and cooling member 50.

Advantageously, the base 61 has an optimized shape or composition such that it promotes heat exchanges between the switching element 66 and the cooling member 50.

Furthermore, the fact that the pressing elements 84 are regularly distributed around the electrical assembly 59 over a perimeter of the base 61 makes it possible to better distribute the pressing force E and therefore to optimize the contact between the base 61 and the cooling member 50, i.e., to optimize heat exchanges between the switching device 46, in particular the electrical assembly 59, and the cooling device 40.

Furthermore, in the example of the three-phase motor 26, it is possible to use three identical switching devices 46, i.e., standardized, to perform the electrical conversion function. This makes it possible to reduce the manufacturing and maintenance costs of the traction box 30.

More generally, the use of standardized switching devices 46 makes it possible to offer a traction box 30 whereof the converter 38 has a configurable configuration owing to the addition or removal of switching devices 46.

Lastly, the fact that the electrical assembly 59 has a central position on the base 61, the pressing elements 84 are arranged around the electrical assembly and extend between a perimeter of the base 61, and the support element 82 and the screws 98 are located on the outside of the switching device 46, makes it possible to separate the electrical functions related to the electrical assembly 59, from the pressing functions of the electrical assembly 59 against the cooling member 50 and fastening functions of the control device 46 in the traction box 30 to the cooling member 50. Thus, each element of the switching device 46 can be configured in order to perform the function to which it is dedicated optimally, i.e., the electrical assembly 59 for example does not need to be configured to withstand the pressing force, since the pressing force is applied on the base 61. Furthermore, this arrangement of the fastening system 62 and the pressing system 60 makes it possible to optimize the contact between the base 61 and the cooling member 50, and therefore the cooling of the electrical assembly 59.

The embodiments and alternatives considered above can be combined with one another to create new embodiments of the invention.

The invention claimed is:

1. An electrical switching device of an electrical power module able to be integrated into an electrical traction box of a transport vehicle, the traction box comprising a cooling device able to cool the switching device, the switching device comprising:
    an electrical assembly provided with an electrical switching element, and
    a pressing device for pressing the electrical assembly comprising a support element of the electrical assembly and pressing elements of the electrical assembly,
    wherein the switching device comprises a base for receiving the electrical assembly, the base being intended to be positioned between the electrical assembly and the cooling device when the switching device is integrated into the traction box, and wherein the pressing elements extend between the support element and the base and are configured to exert a bearing force on the base able to keep the base against the cooling device when the switching device is integrated into the traction box.

2. The electrical switching device according to claim 1, wherein the switching device comprises a fastening device for fastening in the traction box, the fastening device being able to keep the support element in a predetermined position relative to the cooling device.

3. The device according to claim 2, wherein the fastening device is able to fasten the switching device removably to the cooling device.

4. The switching device according to claim 1, wherein the switching device comprises a housing comprising the electrical assembly, the pressing device and the base.

5. The switching device according to claim 1, wherein the electrical assembly is provided with a control unit for the switching element and electrical connections.

6. The device according to claim 1, wherein the switching element is fastened to the base, and wherein the base comprises, around the switching element, at least one pressing zone in contact with the pressing elements, the pressing zone extending globally parallel to a plane perpendicular to a direction of the bearing force.

7. The device according to claim 1, wherein the pressing elements are regularly distributed around the switching element.

8. At least one switching device according to claim 1 integrated into the electrical traction box of the transport vehicle,
    wherein the traction box further comprises the cooling device able to cool the at least one switching device,
    wherein the base of the at least one switching device is positioned between the electrical assembly of the switching device and the cooling device, and the pressing elements of the pressing device of the at least one switching device are configured to exert a bearing force on the base able to keep the base against the cooling device.

9. The at least one switching device according to claim 8, wherein a dry thermal interface material, able to improve the thermal coupling between each base and the cooling device, is positioned between each base and the cooling device.

10. The at least one switching device according to claim 8, wherein the cooling device comprises a heat exchanger, a cooling member of each switching device, the cooling member being in contact with each base of each switching device and a cooling circuit extending between the heat exchanger and the cooling member.

11. The device according to claim 1, wherein the switching element is fastened to the base, and wherein the base comprises, around the switching element, and around the electrical element, at least one pressing zone in contact with the pressing elements, the pressing zone extending globally parallel to a plane perpendicular to a direction of the bearing force.

12. The device according to claim 1, wherein the pressing elements are regularly distributed around the switching element, and around the electrical assembly.

* * * * *